US 6,696,353 B2

(12) United States Patent
Minn et al.

(10) Patent No.: US 6,696,353 B2
(45) Date of Patent: Feb. 24, 2004

(54) INTEGRATED CIRCUIT CHIP HAVING ANTI-MOISTURE-ABSORPTION FILM AT EDGE THEREOF AND METHOD OF FORMING ANTI-MOISTURE-ABSORPTION FILM

(75) Inventors: Eun-young Minn, Anyang (KR); Young-hoon Park, Suwon (KR); Chi-Hoon Lee, Suwon (KR); Hyo-dong Ban, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/396,902

(22) Filed: Mar. 25, 2003

(65) Prior Publication Data

US 2003/0181045 A1 Sep. 25, 2003

Related U.S. Application Data

(62) Division of application No. 09/715,372, filed on Nov. 17, 2000, now Pat. No. 6,566,735.

(30) Foreign Application Priority Data

Nov. 26, 1999 (KR) ............................................. 99-52997

(51) Int. Cl.⁷ ............................................. H01L 21/301
(52) U.S. Cl. ........................ 438/462; 438/460; 438/455; 257/620
(58) Field of Search .................................. 438/455, 460, 438/462; 257/620, 529, 208, 209

(56) References Cited

U.S. PATENT DOCUMENTS

| | | | |
|---|---|---|---|
| 5,025,300 A | 6/1991 | Billig et al. | 357/51 |
| 5,414,297 A | 5/1995 | Morita et al. | 257/620 |
| 5,827,759 A | 10/1998 | Froehner | 438/132 |
| 5,879,966 A | 3/1999 | Lee et al. | 438/132 |
| 5,936,296 A | 8/1999 | Park et al. | 257/529 |
| 5,990,537 A | 11/1999 | Endo et al. | 257/529 |
| 6,451,681 B1 * | 9/2002 | Greer | 438/601 |

FOREIGN PATENT DOCUMENTS

JP    9-69571    11/1997    ......... H01L/21/82

* cited by examiner

Primary Examiner—Van Thu Nguyen
Assistant Examiner—Brad Smith
(74) Attorney, Agent, or Firm—Mills & Onello LLP

(57) ABSTRACT

An integrated circuit chip having an anti-moisture-absorption film at the edge thereof and a method of forming the anti-moisture-absorption film are provided. In the integrated circuit chip which has predetermined devices inside and whose uppermost layer is covered with a passivation film, a trench is formed by etching interlayer dielectric films to a predetermined depth along the perimeter of the integrated circuit chip to be adjacent to the edge of the integrated circuit chip and an anti-moisture-absorption film is formed to fill the trench or is formed on the sidewall of the trench to a predetermined thickness, in order to prevent moisture from seeping into the edge of the integrated circuit chip. Moisture is effectively prevented from seeping into the edge of the chip by forming the anti-moisture-absorption film at the edge of the chip using the conventional processes of manufacturing the integrated circuit chip without an additional process.

11 Claims, 11 Drawing Sheets

INTEGRATED CIRCUIT CHIP HAVING ANTI-MOISTURE-ABSORPTION FILM AT EDGE THEREOF AND METHOD OF FORMING ANTI-MOISTURE-ABSORPTION FILM

RELATED APPLICATIONS

This application is a divisional of copending U.S. application Ser. No. 09/715,372, filed on Nov. 17, 2000 now U.S. Pat. No. 6,566,735, the contents of which are incorporated herein in their entirety by reference.

BACKGROUND OF THE INVENTION

1. Field of the Invention

The present invention relates to an integrated circuit chip and a method of manufacturing the same, and more particularly, to a structure at the edge of an integrated circuit chip and a method of forming the same.

2. Description of the Related Art

A plurality of integrated circuit chips are generally simultaneously formed on one wafer. The completed chips are sawed one by one and are packaged. Referring to FIG. 1 which is a plan view showing part of the surface of a wafer on which a plurality of integrated circuit chips are formed, chips 10 are formed on the wafer at predetermined intervals using the same process. The chips 10 are separated from each other by scribe lines 20 which define spaces for sawing the chips 10.

Referring to FIG. 2 which is an enlarged sectional view taken along the line 2—2 of FIG. 1, metal interconnections 40 and a contact 60 are formed in the chip 10. Interlayer dielectric films 30 are interposed between the metal interconnections 40. The uppermost part is covered with a passivation film 50. Also, since the area occupied by the scribe lines 20 is not generally used as a device, only interlayer dielectric films 30 and a passivation film 50 exist. However predetermined circuit patterns 45 referred to as a test element group (TEG) may be formed in order to estimate the characteristics of a device which is being designed in advance. Also, trenches 70 are formed at the boundaries of the chips 10 and the scribe lines 20. This is for cutting the passivation film 50, since mechanical shock generated when the chips are sawed along the center of the scribe line 20 and separated from each other is transmitted to the chip 10 through the passivation film 50 formed of silicon nitride, which is a hard material. The shock is strong if there is no trench 70, thus causing cracks to occur in the passivation film 50 and the device under the passivation film 50 of the chip 10. The trench 70 is formed in an etching process also used to form a fuse opening (not shown) of the chip 10 without in order to reduce the number of processes. The wafer is sawed along the center of the scribe line 20 and divided into separate chips. In FIG. 2, the part between dotted lines 80 is sawed and removed. The entire width of the scribe line 20 is generally between about 100 and 120 $\mu$m. The width of the sawed and removed part (the part between dotted lines 80) is generally between about 30 and 60 $\mu$m.

In general, before the completed chips 10 are sawed, the reliability of the wafer shown in FIG. 2 is tested at a temperature of between 100 and 150° C., a humidity of between 80 and 100%, and a pressure of between 1.5 and 3 atm, in order to estimate whether the completed integrated circuit chips operate in a stable condition at a high temperature, a high humidity, and a high pressure.

The interlayer dielectric films 30 exposed on the sidewalls of the trenches 70 located at the edges of the chips 10 are usually formed of silicon oxide such as boron phosphorous silicate glass (BPSG), phosphorous silicate glass (PSG), spin on glass (SOG), tetra ethyl ortho silicate (TEOS), and undoped silicate glass (USG), which have an excellent planarization characteristic. However, the BPSG, the PSG, the SOG, and the TEOS, which include a high concentration of impurities such as boron greater than or equal to 5 weight % and phosphorous greater than or equal to 4 weight %, are vulnerable to moisture. Furthermore, in order to prevent changes in the characteristics of the device, the interlayer dielectric films 30 are formed at a low temperature. Therefore, when moisture seeps into interfaces between the interlayer dielectric films 30 vulnerable to moisture while test the reliability of the device, the metal interconnections 40 formed of tungsten or aluminum and the contact 60 in an adjacent peripheral circuit erode and the interfaces between the interlayer dielectric films 30 or the interfaces between the interlayer dielectric films 30 and the metal interconnections 40 are peeled from each other, or cracks occur in the interfaces between the interlayer dielectric films 30 or the interfaces between the interlayer dielectric films 30 and the metal interconnections 40. Accordingly, the reliability of the device severely deteriorates.

Similar problems occur in the fuse opening (not shown) in the chip 10. In order to solve the problems in the fuse opening, a method of forming an anti-moisture-absorption film with a moisture-proof material on the sidewall of the fuse opening (U.S. Pat. No. 5,879,966) and a method of forming a ring-shaped guard ring which surrounds the fuse opening (Japanese Patent Publication No. Hei 9-69571) are provided. However, when using these methods, it is necessary to add process steps. Also, such methods have not been provided with respect to the edges of the chips.

SUMMARY OF THE INVENTION

To solve the above problem, it is an object of the present invention to provide an integrated circuit chip having a structure capable of preventing moisture from seeping into the edge of the chip.

It is another object of the present invention to provide a method of forming an anti-moisture-absorption film capable of preventing moisture from seeping into the edge of a chip without an additional process.

In accordance with the present invention, an integrated circuit chip is provided with a plurality of devices formed in the integrated circuit chip. A passivation film is formed on the integrated circuit chip. A trench is formed at a predetermined depth along the perimeter of the integrated circuit chip adjacent to the edge of the integrated circuit chip. An anti-moisture-absorption film is formed in the trench at a predetermined thickness. The anti-moisture-absorption film prevents moisture from seeping into the edge of the integrated circuit chip.

The trench can be formed by etching interlayer dielectric films of the device to the predetermined depth. The anti-moisture-absorption film can be formed on a sidewall of the trench.

The anti-moisture-absorption film can be formed by extending the passivation film at least to the sidewall of the trench.

The anti-moisture-absorption film may comprise a conductive layer pattern which fills the trench or is formed on the sidewall of the trench to a predetermined thickness and a passivation film extended so as to cover the conductive layer pattern.

In accordance with the invention, there is also provided a method of forming an anti-moisture-absorption film at a boundary between an integrated circuit chip and a scribe line, in a wafer on which a plurality of integrated circuit chips are formed by interposing the scribe line. In the method of forming the anti-moisture-absorption film, predetermined devices, a lower interconnection layer, and an insulating layer on the lower interconnection layer are formed in an area where the chips are formed by sequentially stacking predetermined material layer and interlayer dielectric films on the wafer. A contact hole which exposes the lower interconnection layer is formed in a predetermined position of the chip by etching the insulating layer on the lower interconnection layer, and a trench is formed to a predetermined depth by etching interlayer dielectric films stacked at the boundary between the chip and the scribe line at the same time. After forming a conductive layer by depositing a conductive material which will form an upper interconnection layer of the integrated circuit chip on the entire surface of the wafer on which the contact hole and the trench are formed, the upper interconnection layer and a contact are formed in the chip by patterning the conductive layer and the conductive material is removed inside and around the trench at the same time. The passivation film is formed by depositing a moisture-proof material on the entire surface of the wafer on which the upper interconnection layer is formed. The anti-moisture-absorption film is formed with the passivation film formed inside the trench by removing part of the passivation film at the boundary between the chip and the scribe line.

According to one embodiment of the present invention, an anti-moisture-absorption film is formed with a conductive material film left on the sidewall of the trench or inside the trench when the conductive material layer, which will form the upper interconnection layer, is patterned and the passivation film on the conductive material layer.

In one embodiment, an etching stop film is formed under the lower interconnection layer by extending a predetermined material layer which forms the device of the integrated circuit chip having etching selectivity with respect to interlayer dielectric films to be etched in order to form the trench before forming the lower interconnection layer and the interlayer dielectric films are etched until the etching stop film is exposed, so that the trench can be formed.

According to the present invention, moisture is prevented from seeping into the edge of a chip by forming an anti-moisture-absorption film on the sidewall of a trench formed at the edge of an integrated circuit chip or inside the trench.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
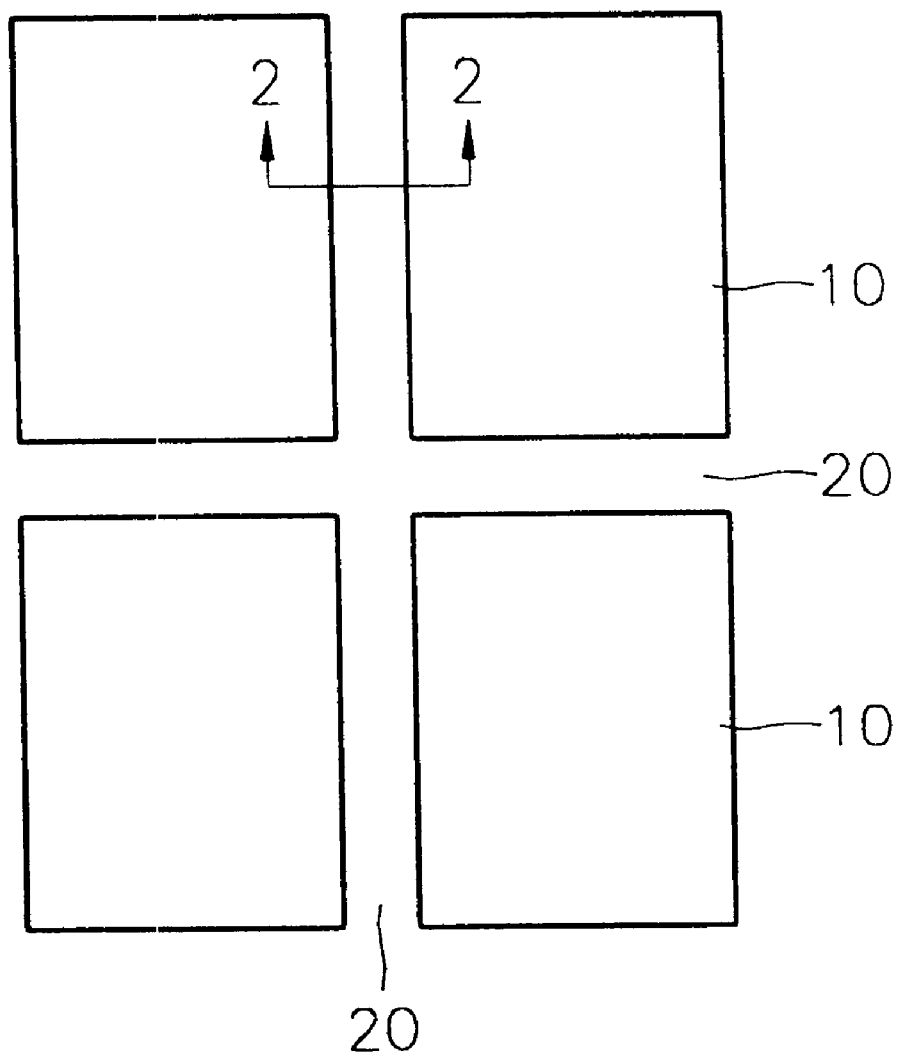
FIG. 1 is a plan view showing part of the surface of a wafer on which a plurality of integrated circuit chips are formed.

The present invention now will be described more fully with reference to the accompanying drawings, in which preferred embodiments of the invention are shown. In the drawings, it will also be understood that when a layer is referred to as being on another layer or substrate, it can be directly on the other layer or substrate, or intervening layers may also be present. Also, each of interlayer dielectric films is described to have a single-layered structure, however, can have a structure where multi-layered interlayer dielectric films are stacked. The thickness or length of layers are exaggerated for clarity.

Figure 2:
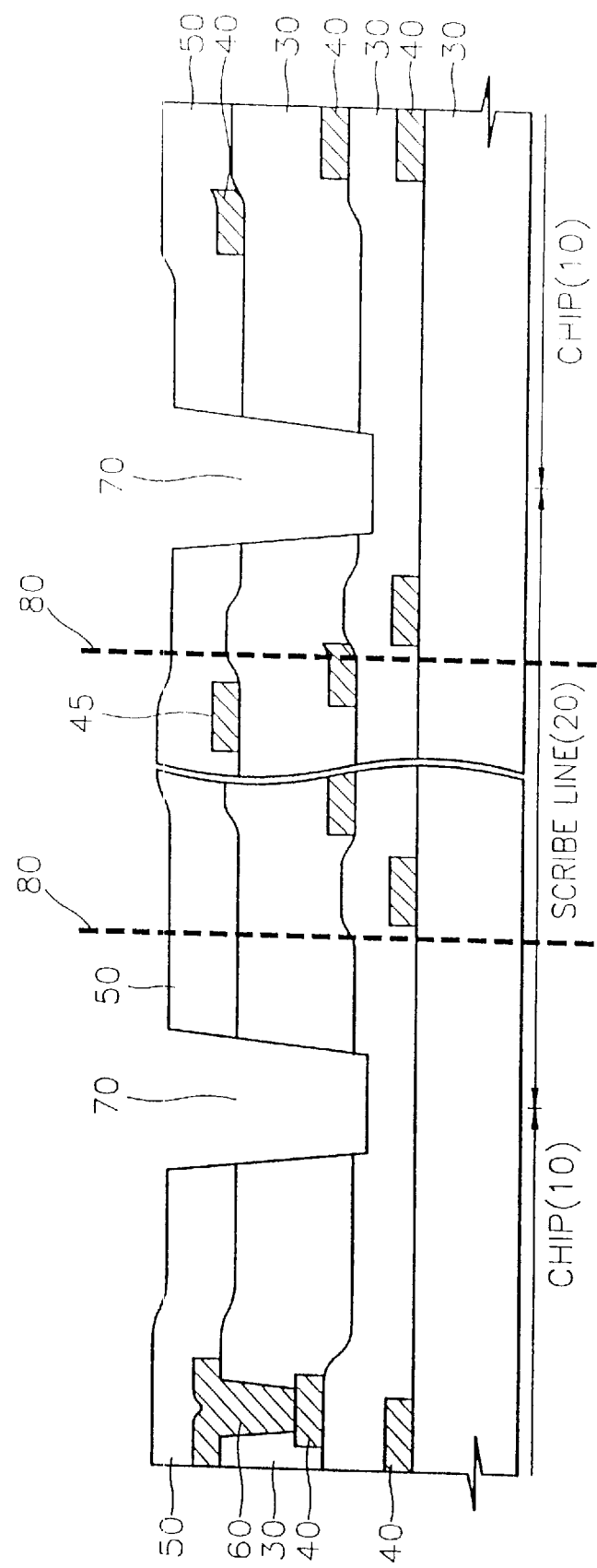
FIG. 2 is an enlarged sectional view taken along the line 2—2 of FIG. 1.

FIGS. 3A through 3F are sectional views showing processes of forming an anti-moisture-absorption film at the edge of an integrated circuit chip according to an embodiment of the present invention and the structure of the chip edge formed thereby. Chip areas and scribe lines of only one side are shown in FIGS. 3A through 3F unlike in FIG. 2. The chip areas and the scribe lines of only one side are shown in other embodiments.

Figure 3A:
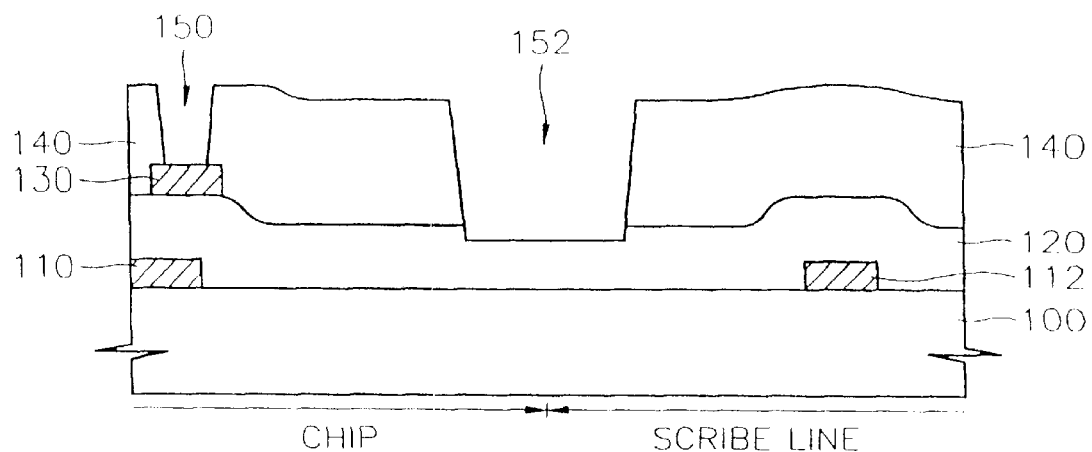
FIGS. 3A through 3F are sectional views showing processes of forming an anti-moisture-absorption film at the edge of an integrated circuit chip according to an embodiment of the present invention and the structure of the chip edge formed thereby.

Referring to FIG. 3A, a trench is formed at the boundary between a chip and a scribe line. Material layer patterns 110 which form a predetermined device are formed in the chip on a substrate or an interlayer dielectric film 100. Predetermined material layer patterns 112 can be simultaneously formed in the scribe line for a test element group (TEG). Here, since the characteristic part of the present invention is the boundary between the chip and the scribe line, a detailed description of a device or material layer patterns formed inside the chip and in the center of the scribe line excluding the boundary will be omitted. In the case of a memory device, the respective memory cells and a peripheral circuit for driving the respective memory cells are generally formed inside the chip.

After forming an interlayer dielectric film 120, a lower interconnection layer 130 of the chip is formed. The lower interconnection layer 130 is formed by depositing a conductive material, for example, a metal such as tungsten or aluminum, on the entire surface of the interlayer dielectric film 120 (a barrier metal layer may be included under a metal layer when the metal is used) and patterning the metal in a desired interconnection pattern.

A contact hole 150 is formed by depositing an interlayer dielectric film 140 such as a silicon oxide film on the entire surface of the resultant on the lower interconnection layer 130 to a thickness of between 5,000 and 10,000 Å and by etching the interlayer dielectric film 140 in a portion where a contact is to be formed. A trench 152 is simultaneously formed at the boundary between the chip and the scribe line.

To be specific, the contact hole 150 which exposes the lower interconnection layer 130 is formed in the chip, and the trench 152 is formed at the boundary between the chip and the scribe line at the same time by forming a photoresist pattern (not shown) which exposes the portions of the interlayer dielectric film 140 to be etched and plasma etching the interlayer dielectric film 140 formed of the silicon oxide using $CF_4$ having a flow rate of between 35 and 50 sccm and $CHF_3$ having a flow rate of between 35 and 50 sccm as etching gases, and flowing Ar having a flow rate of between 300 and 450 sccm, at a pressure of between 300 and 500 mTorr, and at an RF power of between 1,100 and 1,400W, for between 100 and 150 seconds. The width of the trench 152 is about several μm.

Figure 3B:
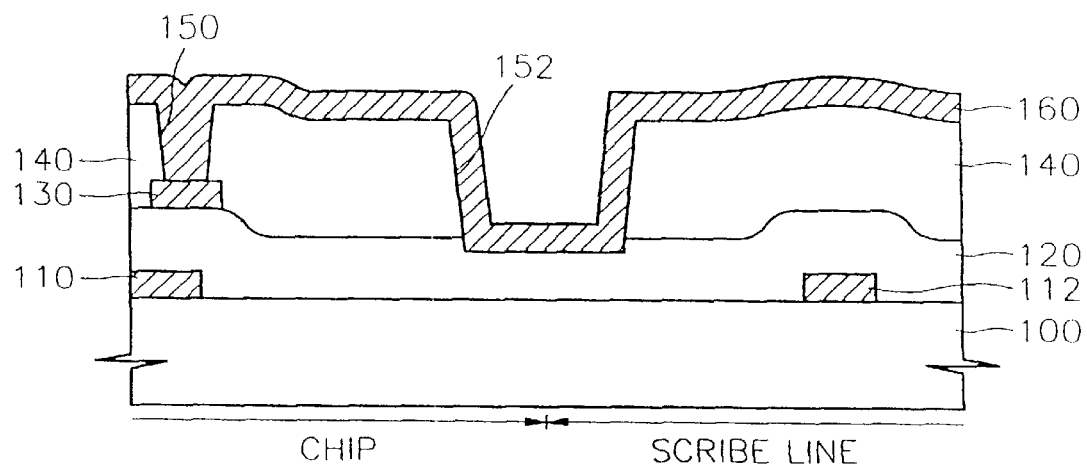

A conductive material layer 160 which fills the contact hole 150 is formed and the conductive material layer 160 is also formed in the trench 152, as shown in FIG. 3B, when the conductive material, for example, a metal such as tungsten or aluminum, is deposited on the entire surface of the resultant of FIG. 3A to a thickness of between 6,500 and 10,000 Å in order to form an upper interconnection layer on the entire surface of the resultant structure.

Figure 3C:
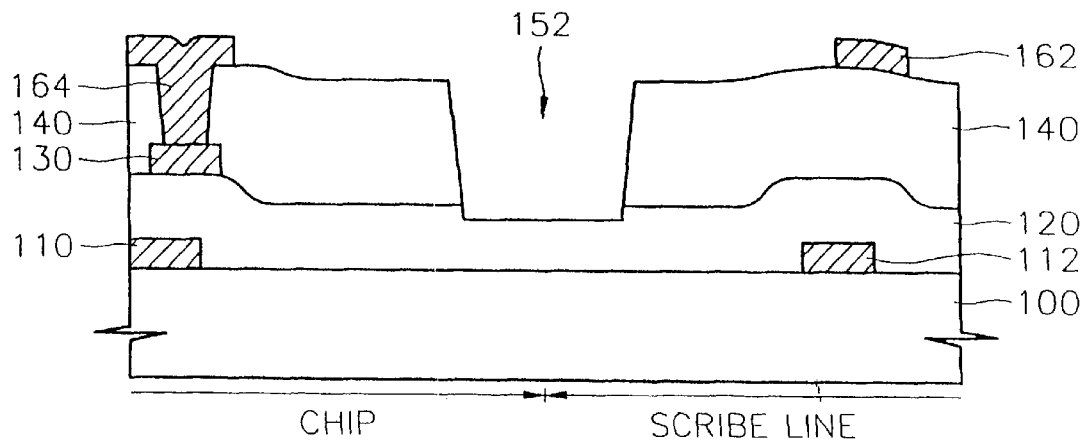

Referring to FIG. 3C, the conductive material layer 160 is patterned. As a result, an upper interconnection layer 164 including a contact is formed in the chip and the conductive material is completely removed inside and around the trench 152. At this time, an interconnection pattern 162 can be formed in the scribe line, if necessary.

Figure 3D:
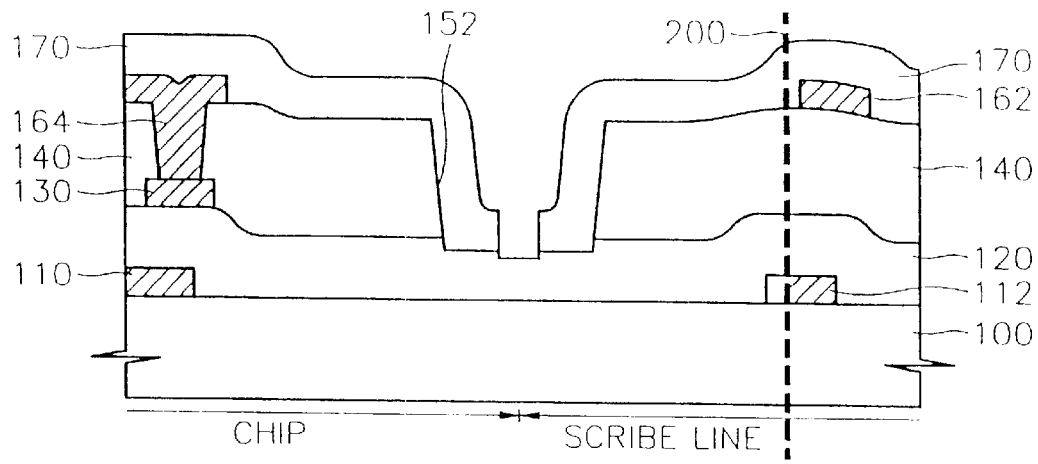

Referring to FIG. 3D, a passivation film 170 used as the anti-moisture-absorption film is formed on the uppermost layer of the chip and the sidewall of the trench 152. The interlayer dielectric film 120 is exposed in the center of the bottom of the trench 152, since part of the passivation film 170 is removed.

In order to form the structure shown in FIG. 3D, a moisture-proof film such as a silicon nitride film, a silicon oxide film which is not doped with impurities or is doped with a low concentration of impurities, or a compound film of the above films is formed on the entire surface of the resultant structure of FIG. 3C. In the present embodiment, the silicon oxide film which is not doped with impurities is deposited to a thickness of between 1,000 and 2,000 Å. The silicon nitride film is deposited on the silicon oxide film to a thickness of between 5,000 and 10,000 Å. As a result, an interface between the interlayer dielectric films 120 and 140, which is exposed on the sidewall of the trench 152 and can be a moisture-absorption path, is covered with the passivation film 170. Accordingly, the moisture-absorption path is blocked by the passivation film 170.

A chip edge structure is completed by removing part of the passivation film 170, thus exposing the interlayer dielectric film 120 so that mechanical shock is not transmitted through the passivation film 170 when the wafer is sawed along the center of the scribe line. The interlayer dielectric film 120 is exposed at the bottom of the trench 152 in a process of exposing the upper interconnection layer 164 by etching the passivation film 170 in order to form a bonding pad (not shown) for wire bonding, so that an additional process is not needed. The interlayer dielectric film 120 is exposed in the center of the trench 152 and the bonding pad (not shown) in which the upper interconnection layer 164 is exposed is formed in a predetermined position of the chip by performing a photolithography process. To be specific, a photoresist pattern (not shown) is formed to expose a portion in which the bonding pad is to be formed and the center of the trench 152, and the passivation film 170 formed by stacking the silicon oxide film and the silicon nitride film is plasma etched using $CF_4$ having a flow rate of between 65 and 90 sccm and $O_2$ having a flow rate of between 10 and 25 sccm as etching gases, and flowing Ar having a flow rate of between 80 and 110 sccm, at a pressure of between 300 and 500 mTorr, and at an RF power of between 1,000 and 1,300W, for between 60 and 95 seconds.

When the reliability of the integrated circuit chip is tested at a high temperature, a high humidity, and a high pressure in the state that the anti-moisture-absorption film is formed of the passivation film 170 on the sidewall of the trench 152, moisture is prevented from seeping into the sidewall of the trench formed at the boundary between the chip and the scribe line, unlike in the conventional technology. Accordingly, reliable integrated circuit chips are obtained.

When the chips are sawed along the center of the scribe lines after the reliability of the integrated circuit chips tested, the right side of a dotted line 200 is cut and removed and the chip on the left side of the dotted line 200 is divided into separate chips.

Figure 3E:
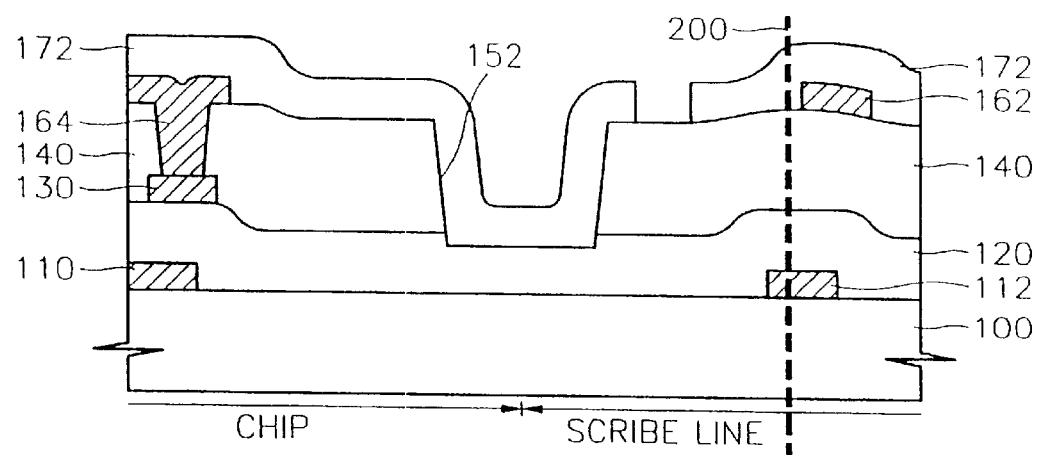

FIG. 3E is a modification of the present embodiment. The position where part of a passivation film 172 is removed in FIG. 3E is different from the position where part of the passivation film 170 is removed in FIG. 3D. Meanwhile it is probable that a small amount of moisture will seep into the interface between the interlayer dielectric film 120 exposed to the bottom of the trench 152 and the passivation film 170 in the structure shown in FIG. 3D. However, the seeping of moisture is completely prevented in the structure shown in FIG. 3E.

Figure 3F:
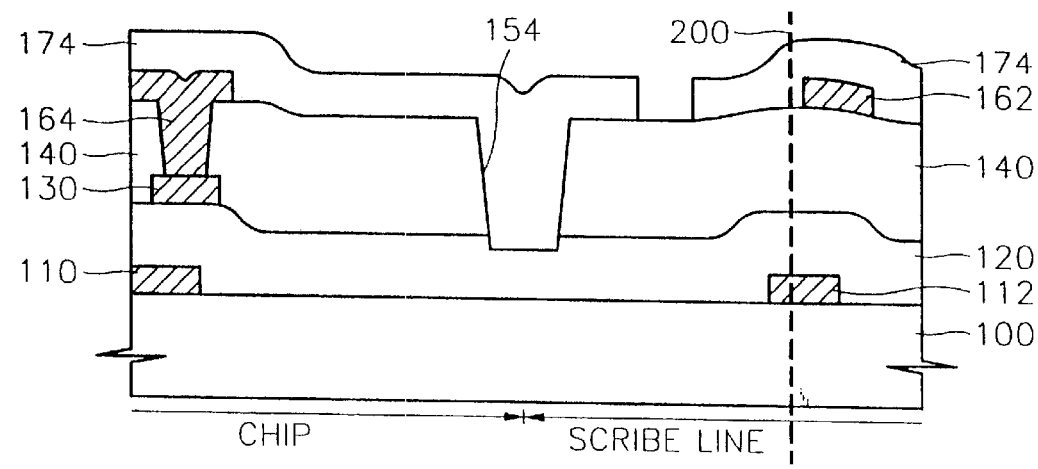

FIG. 3F is another modification of the present invention, in which a passivation film 174 fills a trench 154. Here, the width of the trench 154 is formed to be equal to or less than twice the thickness of the passivation film 174 so that the passivation film 174 fills the trench 154. In the structure shown in FIG. 3F, it is possible to completely prevent the seeping of moisture like in the structure shown in FIG. 3E.

Figure 4A:
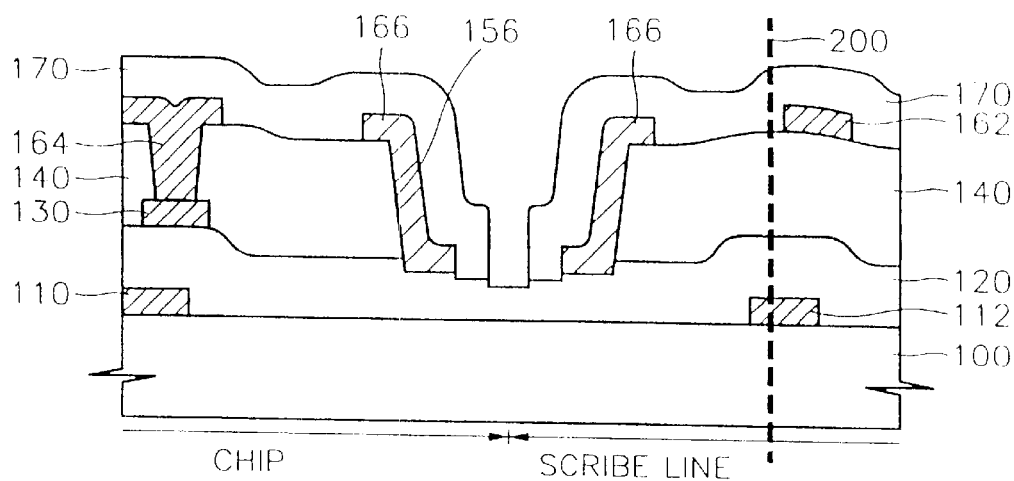
FIGS. 4A through 4C are sectional views showing a structure in which an anti-moisture-absorption film is formed at the edge of an integrated circuit chip according to another embodiment of the present invention.
Figure 4B:
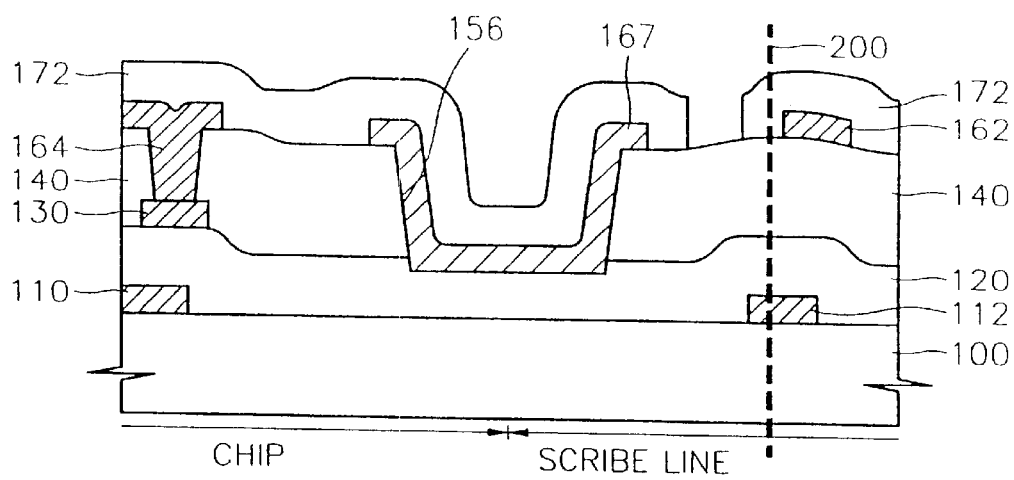
Figure 4C:
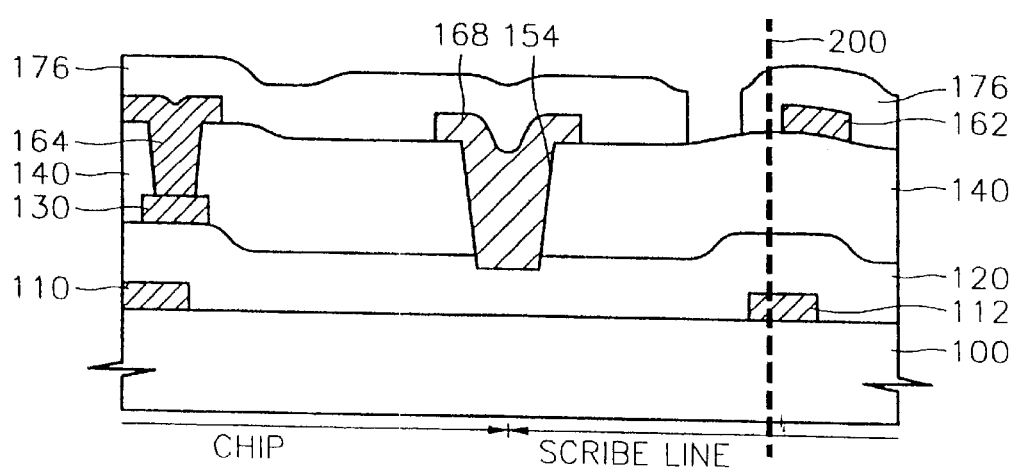

FIGS. 4A through 4C are sectional views showing the structure of the edge of a chip according to another embodiment of the present invention. Conductive material patterns 166, 167, and 168 which are formed of the same material as the upper interconnection layer 164 in the chip are left inside the trench or on the sidewall of the trench in the present embodiment, unlike in the embodiment described above in connection with FIGS. 3A through 3F.

In order to form the structure shown in FIG. 4A, in the step corresponding to FIG. 3C of the embodiment of FIGS. 3A through 3F, the conductive material is not completely removed inside and around the trench 156 when the upper interconnection layer 164 is formed and is left on the sidewall of the trench 156. The structure shown in FIG. 4A is obtained through the same process as the embodiment of FIGS. 3A through 3F described with reference to FIG. 3D. The width of the trench 156 is made wider than the width of the trench 152 shown in FIG. 3A, considering the thickness of the conductive material pattern 166 left on the sidewall of the trench 156.

The edge of the chip having the structure shown in FIG. 4B is a modification of the present embodiment, in which the conductive material pattern 167 is left on the sidewall and the bottom of the trench 156. The part of the passivation film 172 is removed in a portion on the scribe line side adjacent to the trench 156.

The structure shown in FIG. 4C is another modification of the present embodiment, in which the conductive material pattern 168 fills the trench 154. In order to form the edge of the chip having the structure shown in FIG. 4C, after the width of the trench 154 is formed to be equal to or less than twice the thickness of the conductive material layer 168 so that the conductive material layer 168 fills the trench 154, the conductive material layer 168 which fills the trench 154 is left when the upper interconnection layer 164 of the chip is formed, like in the structure shown in FIG. 3F of the embodiment of FIGS. 3A through 3F.

In FIGS. 4A through 4C, the upper interconnection layer 164 is described as being separated from the conductive material patterns 166, 167, and 168 left on the sidewalls of the trench 156 or inside the trench 154. However, the upper interconnection layer 164 does not need to be separated from the conductive material patterns 166, 167, and 168 unless there is an electrical influence such that the conductive material patterns 166, 167, and 168 on the sidewalls of the trenches or inside the trenches are connected to other elements. This is true of the embodiment of FIGS. 6A through 6C described below in detail.

In the present embodiment, it is possible to prevent moisture from seeping into the edge of the chip since the interface between the interlayer dielectric films 120 and 140 which becomes the moisture-absorption path is not exposed.

FIGS. 5A through 5F are sectional views showing processes of forming the anti-moistureabsorption film at the edge of the chip according to a third embodiment of the present invention and the structure of the chip edge formed thereby. The third embodiment is different from the first embodiment of FIGS. 3A through 3F only in that an etching stop film is formed with a predetermined material layer 190 which forms a device in the chip under the lower interconnection layer 130, so as to easily control the depth to which the interlayer dielectric films 140 and 122 are etched in order to form the trench 152.

Figure 5A:
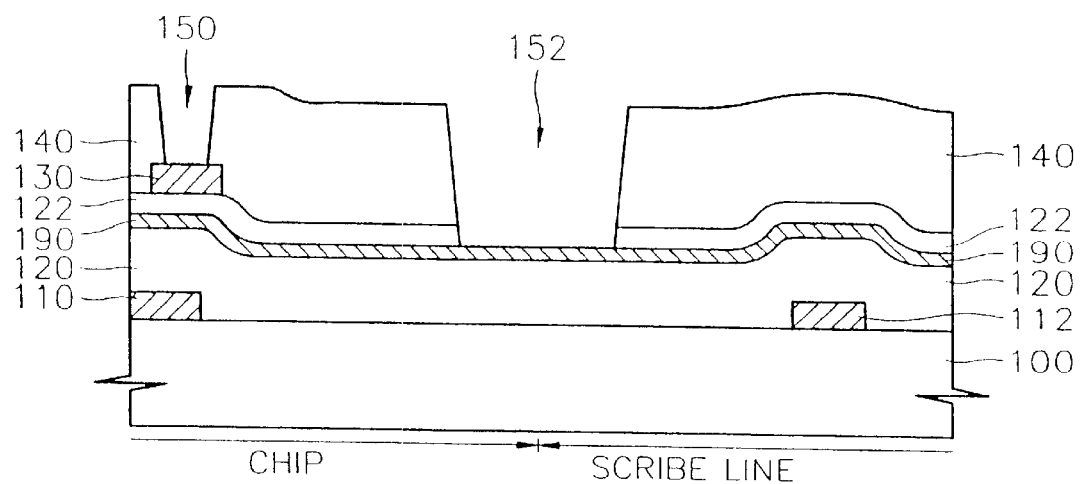
FIGS. 5A through 5F are sectional views showing processes of forming an anti-moisture-absorption film at the edge of an integrated circuit chip according to still another embodiment of the present invention and the structure of the chip edge formed thereby.

Referring to FIG. 5A, the material layer patterns 110 which form a predetermined device are formed on the substrate or the interlayer dielectric film 100 and the interlayer dielectric film 120 is formed on the material layer pattern 110, like in FIG. 3A. The predetermined material layer 190 which forms the device in the chip is formed on the interlayer dielectric film 120 to be extended to the scribe line. The material layer 190 can be formed of polycrystalline silicon which is doped with impurities, which forms the upper electrode of a memory cell capacitor when the device formed in the chip is a DRAM device. The material layer 190 can be formed of other interconnections and a material having etching selectivity with respect to the interlayer dielectric films 122 and 140 which is generally formed of the silicon oxide thereon. It is not necessary that the material layer 190 must be formed of the conductive material.

After forming the lower interconnection layer 130 by interposing the interlayer dielectric film 122 on the material layer 190 which will become the etching stop film and forming the interlayer dielectric film 140 on the lower interconnection layer 130, the trench 152 is formed together with the contact hole 150 of the chip and at the boundary between the chip and the scribe line as described in FIG. 3A. The contact hole 150 and the trench 152 are etched to have different depths, however, they can be simultaneously formed by etching until both the lower interconnection layer 130 and the etching stop film 190 are exposed. Therefore, it is possible to etch the trench 152 to a uniform depth.

Figure 5B:
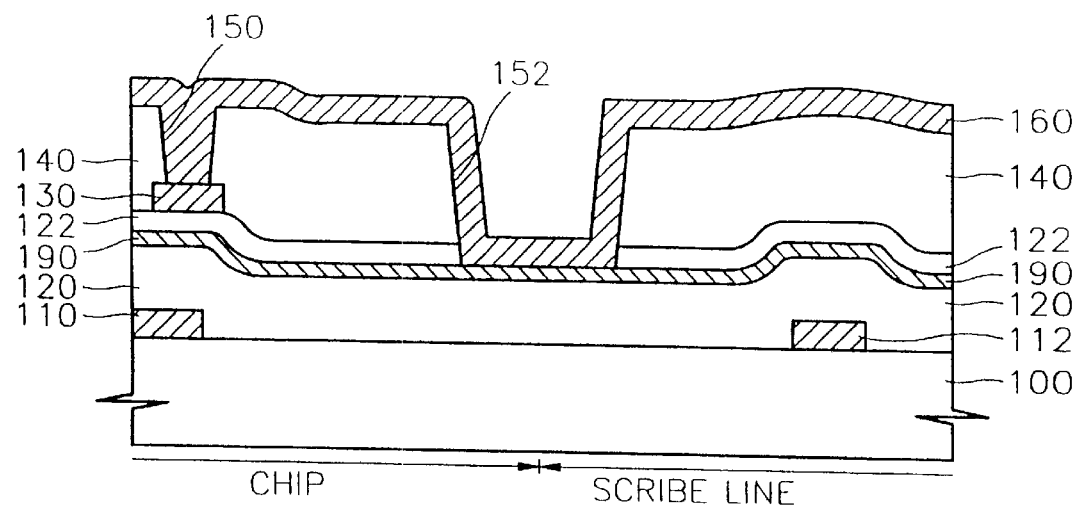

As shown in FIG. 5B, the conductive material layer 160 is formed by depositing the conductive material which will form the upper interconnection layer of the chip on the entire surface of the resultant of FIG. 5A.

Figure 5C:
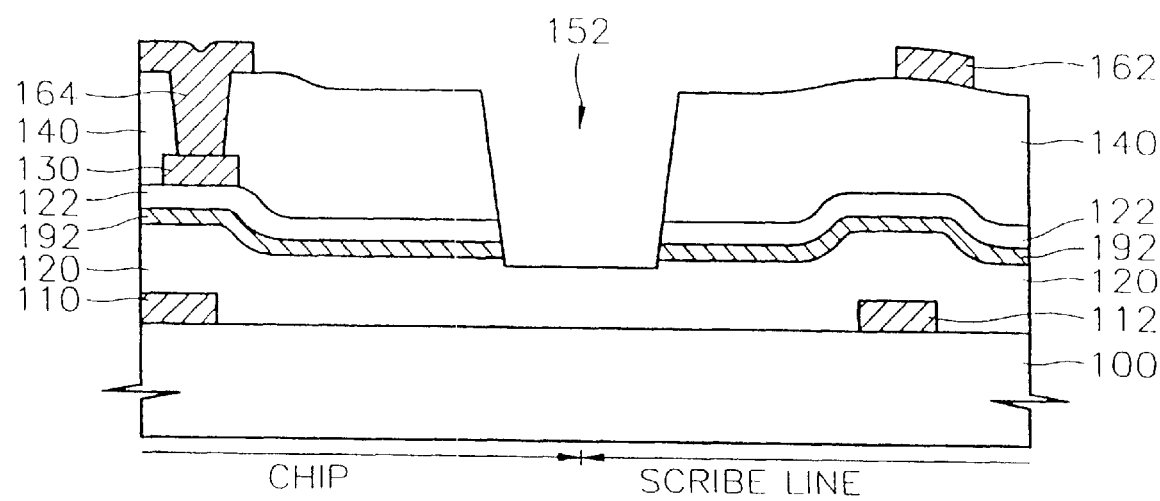

As shown in FIG. 5C, a predetermined interconnection pattern 162 in the scribe line and in the upper interconnection layer 164 of the chip are formed by patterning the conductive material layer 160, and the conductive material is completely removed inside and around the trench 152. Also, the material layer 190 exposed by removing the conductive material in the trench 152 is removed. Here, the conductive material layer 160 and the material layer 190 exposed at the bottom of the trench 152 can be removed by two-step etching using an etching gas or an etching solution. However, it is convenient to remove the conductive material layer 160 and the material layer 190 used as the etching stop film by successively etching the conductive material layer 160 and the material layer 190 using an etching gas or etching solution having low etching selectivity with respect to the two materials which form the conductive material layer 160 and the material layer 190. Namely, when the conductive material layer 160 and the material layer 190 are formed of aluminum and polycrystalline silicon, respectively, polycrystalline silicon reacts with aluminum due to heat generated when aluminum is deposited and reflown, thus being metalized (it is possible to observe by a scanning electron microscope that polycrystalline silicon is metalized). Therefore, metalized polycrystalline silicon is removed by plasma etching aluminum using $BCl_3$ having a flow rate of between 35 and 60 sccm and $Cl_2$ having a flow rate of between 30 and 50 sccm as etching gases, and flowing $N_2$ having a flow rate of between 10 and 25 sccm, and at a pressure of between 100 and 250 mTorr, an RF power of between 300 and 700W, for between 100 and 160 seconds.

Meanwhile, the exposed material layer 190 which was used as the etching stop film may not be removed, so that it remains on the bottom of the trench 152, unless there is an influence to other elements, as in the embodiment of FIGS. 6A through 6C described below in detail.

Figure 5D:
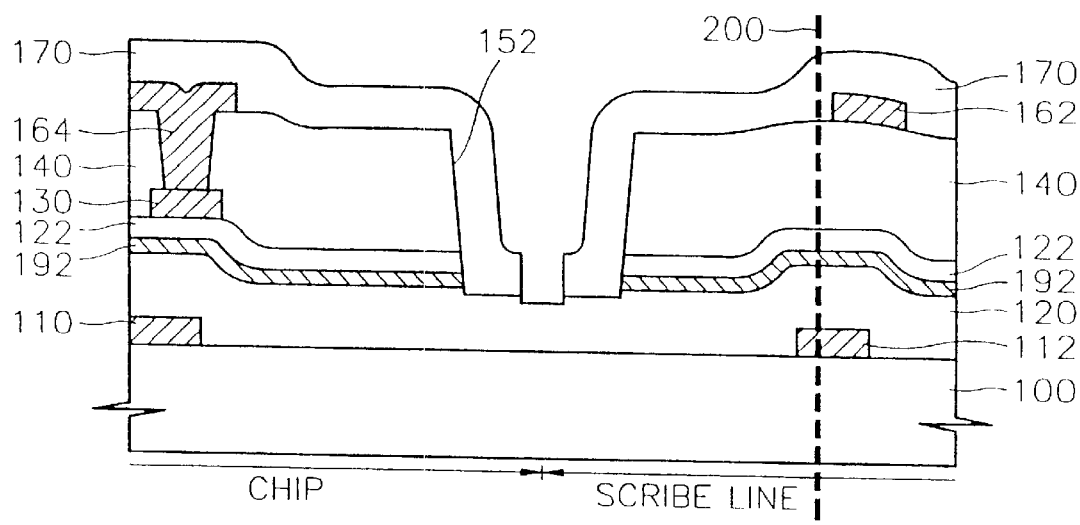

The structure shown in FIG. 5D is obtained through the process described with reference to FIG. 3D.

Figure 5E:
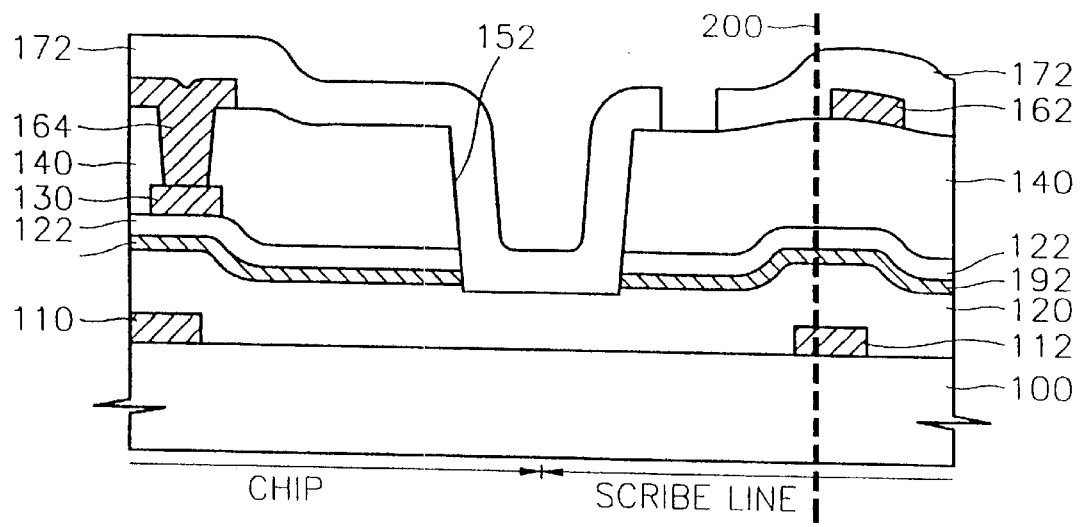
Figure 5F:
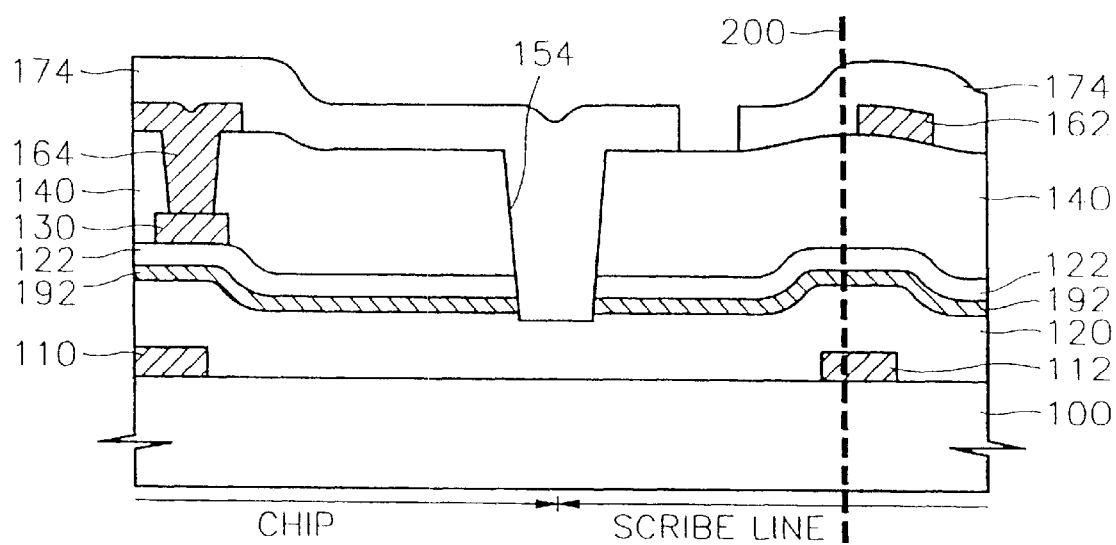

The edge of the chip and the anti-moisture-absorption film having the structures shown in FIGS. 5E and 5F are modifications of the present embodiment. A description of the modifications will be omitted since the modifications are different from the modifications described with reference to FIGS. 3E and 3F only in that the material layer 190 used as the etching stop film (which is etched later and comes to have the form denoted by reference numeral 192) is used.

According to the present embodiment, it is possible to prevent moisture from seeping into the edge of the chip since the anti-moisture-absorption film is formed at the edge of the chip and to easily control the depth to which the trench is etched in the process of forming the anti-moisture-absorption film.

Figure 6A:
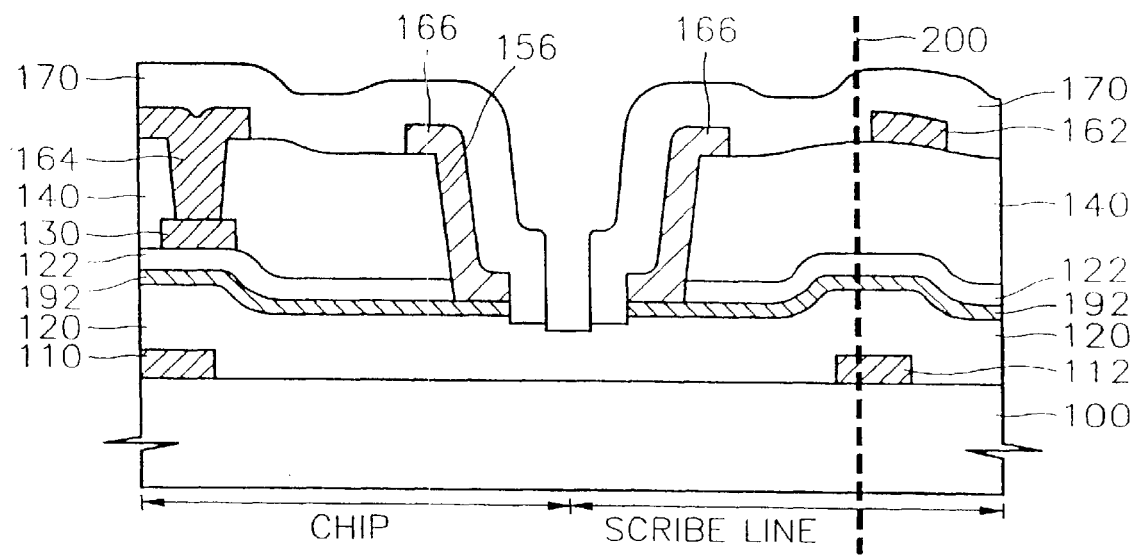
FIGS. 6A through 6C are sectional views showing a structure in which the anti-moisture-absorption film is formed at the edge of the integrated circuit chip according to still another embodiment of the present invention.
Figure 6B:
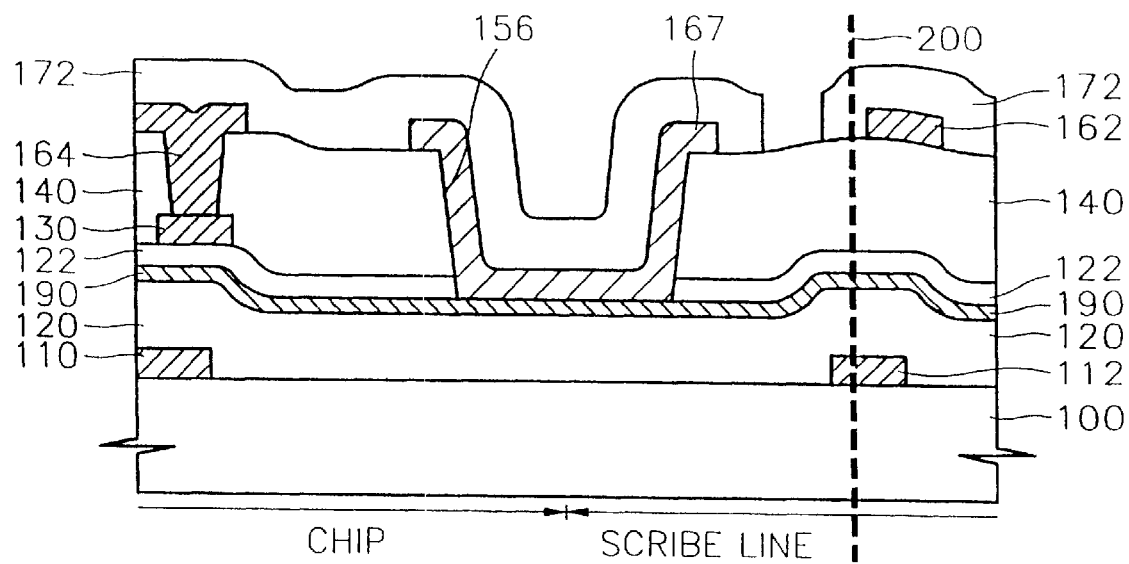
Figure 6C:
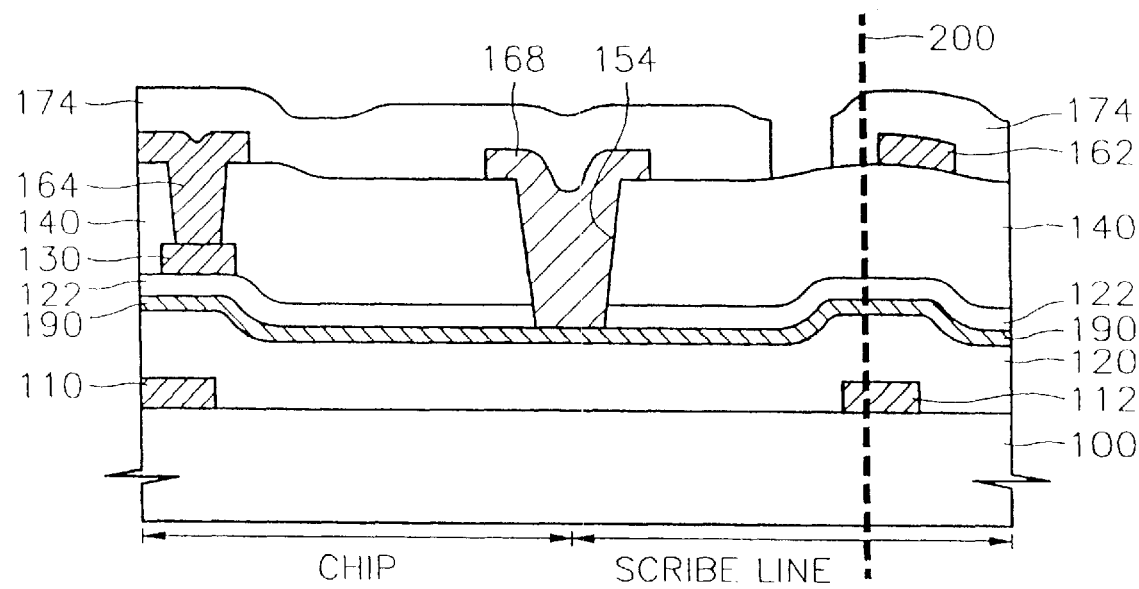

FIGS. 6A through 6C are sectional views showing the structures of the edge of the chip and the anti-moisture-absorption film according to a fourth embodiment of the present invention. The structure of the present embodiment is obtained by combining the structure of the second embodiment of FIGS. 4A through 4C with the structure of the third embodiment of FIGS. 5A through 5F. The etching stop film 190 is used during the etching of the trench and the conductive material patterns 166, 167, and 168 which are formed of the same material as the upper interconnection layer 164 in the chip are left inside the trenches 156 and 154. Since the method of forming the edge of the chip according to the present embodiment is obtained by combining the method of the second embodiment of FIGS. 4A through 4C with the method of the third embodiment of FIGS. 5A through 5F in which the etching stop film 190 is used, a description thereof will be omitted.

As mentioned above, according to the present invention, reliable integrated circuit chips are obtained by preventing moisture from seeping into the edges of the chips when the reliability of the integrated circuit chips are tested. In particular, according to the present invention, the anti-moisture-absorption film is formed at the edge of the chip using conventional process steps used in manufacturing integrated circuit chips without an additional process.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of forming an anti-moisture-absorption film at a boundary between an integrated circuit chip and a scribe line, in a wafer on which a plurality of integrated circuit chips are formed by interposing the scribe line, comprising the steps of:

forming predetermined devices, a lower interconnection layer, and an insulating layer on the lower interconnection layer in an area where the chips are formed by sequentially stacking predetermined material layer and interlayer dielectric films on the wafer;

forming a contact hole which exposes the lower interconnection layer in a predetermined position of the chip by etching the insulating layer on the lower interconnection layer and forming a trench to a predetermined depth by etching interlayer dielectric films stacked at the boundary between the chip and the scribe line, the contact hole and the trench being formed at the same time;

forming a conductive layer by depositing a conductive material which will form an upper interconnection layer of the integrated circuit chip on the entire surface of the wafer on which the contact hole and the trench are formed;

forming the upper interconnection layer and a contact in the chip by patterning the conductive layer and removing the conductive material inside and around the trench at the same time;

forming a passivation film by depositing a moisture-proof material on the entire surface of the wafer on which the upper interconnection layer is formed; and removing part of the passivation film at the boundary between the chip and the scribe line, thereby forming the anti-moisture-absorption film from the passivation film.

2. The method of claim 1, wherein the width of the trench is formed to be equal to or less than twice the thickness of the passivation film so that the passivation film fills the trench and, in the step of removing the part of the passivation film, the part of the passivation film is removed in a portion on the scribe line side adjacent to the trench.

3. The method of claim 1, wherein the width of the trench is formed to be equal to or larger than twice the thickness of the passivation film so that the passivation film is formed to a predetermined thickness along the trench conformally, and in the step of removing part of the passivation film, part of the passivation film is removed in the middle of the bottom of the trench.

4. The method of claim 1, wherein the width of the trench is formed to be equal to or larger than twice the thickness of the passivation film so that the passivation film is formed to a predetermined thickness along the trench conformally, and in the step of removing part of the passivation film, part of the passivation film is removed in a portion on the scribe line side adjacent to the trench.

5. The method of claim 1, further comprising the step of forming an etching stop film under the lower interconnection layer by extending a predetermined material layer which forms the device of the integrated circuit chip having etching selectivity with respect to interlayer dielectric films to be etched in order to form the trench before the step of forming the lower interconnection layer and the insulating layer on the lower interconnection layer, wherein the trench is formed by etching the interlayer dielectric films until the etching stop film is exposed in the step of forming the contact hole and the trench.

6. The method of claim 5, the etching stop film is also removed when the conductive material which will form the upper interconnection layer formed inside and around the trench is removed, in the step of forming the upper interconnection layer.

7. A method of forming an anti-moisture-absorption film at a boundary between an integrated circuit chip and a scribe line in a wafer on which a plurality of integrated circuit chips are formed by interposing the scribe line, comprising the steps of:

forming predetermined devices, a lower interconnection layer, and an insulating layer on the lower interconnection layer in an area where the chips are formed by sequentially stacking predetermined material layers and interlayer dielectric films on the wafer;

forming a contact hole which exposes the lower interconnection layer in a predetermined position of the chip by etching the insulating layer on the lower interconnection layer and forming a trench to a predetermined depth by etching interlayer dielectric films stacked at the boundary between the chip and the scribe line, the contact hole and the trench being formed at the same time;

forming a conductive layer by depositing a conductive material which will form an upper interconnection layer of the integrated circuit chip on the entire surface of the wafer on which the contact hole and the trench are formed;

forming the upper interconnection layer and a contact in the chip by patterning the conductive layer and leaving the conductive material at least inside the trench or on the sidewall of the trench at the same time;

forming the passivation film by depositing a moisture-proof material on the entire surface of the wafer on which the upper interconnection layer is formed; and removing part of the passivation film at the boundary between the chip and the scribe line, thereby forming the anti-moisture-absorption film with the passivation film and the conductive material left at least inside the trench or on the side wall of the trench.

8. The method of claim 7, wherein the width of the trench is formed to be equal to or less than twice the thickness of a conductive material which will form the upper interconnection layer so that the conductive material fills the trench, the conductive material which fills the trench is left in the step of forming the upper interconnection layer, and part of the passivation film is removed in a portion on the scribe line side adjacent to the trench in the step of removing the part of the passivation film.

9. The method of claim 7, wherein the width of the trench is formed to be equal to or larger than twice the thickness of the conductive material which will form the upper interconnection layer so that the conductive material is deposited to a predetermined thickness along the trench conformally, the conductive material deposited inside the trench is left in the step of forming the upper interconnection layer, and part of the passivation film is removed in a portion on the scribe line side adjacent to the trench in the step of removing the part of the passivation film.

10. The method of claim 7, wherein the width of the trench is formed to be equal to or larger than twice the thickness of the conductive material which will form the upper interconnection layer so that the conductive material is deposited to a predetermined thickness along the trench conformally, the conductive material deposited on the sidewall of the trench is left and the conductive material deposited in the middle of the bottom of the trench is removed in the step of forming the upper interconnection layer, and part of the passivation film is removed in the middle of the bottom of the trench in the step of removing the part of the passivation film.

11. The method of claim 7, further comprising the step of forming an etching stop film under the lower interconnection layer by extending a predetermined material layer which forms the device of the integrated circuit chip having etching selectivity with respect to interlayer dielectric films to be etched in order to form the trench before the step of forming the lower interconnection layer and the insulating layer on the lower interconnection layer, wherein the trench is formed by etching the interlayer dielectric films until the etching stop film is exposed in the step of forming the contact hole and the trench.

* * * * *